United States Patent
Kawai et al.

(10) Patent No.: US 8,969,889 B2
(45) Date of Patent: Mar. 3, 2015

(54) SEMICONDUCTOR LIGHT EMITTING DEVICE

(71) Applicant: Stanley Electric Co., Ltd., Meguro-ku, Tokyo (JP)

(72) Inventors: Ryosuke Kawai, Yokohama (JP); Mamoru Miyachi, Okegawa (JP); Tatsuma Saito, Yokohama (JP); Takako Hayashi, Yokohama (JP); Takanobu Akagi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/079,382

(22) Filed: Nov. 13, 2013

(65) Prior Publication Data

US 2014/0131745 A1    May 15, 2014

(30) Foreign Application Priority Data

Nov. 14, 2012    (JP) .................... 2012-250536

(51) Int. Cl.
| | | |
|---|---|---|
| *H01L 21/00* | (2006.01) | |
| *H01L 33/00* | (2010.01) | |
| *H01L 27/15* | (2006.01) | |
| *H01L 33/38* | (2010.01) | |
| *H01L 33/62* | (2010.01) | |

(52) U.S. Cl.
CPC .............. *H01L 27/156* (2013.01); *H01L 33/38* (2013.01); *H01L 33/62* (2013.01); *H01L 2933/0066* (2013.01)
USPC ............................................. 257/88; 438/22

(58) Field of Classification Search
CPC ......... H01L 33/08; H01L 33/38; H01L 33/62; H01L 27/156; H01L 2933/0066
USPC ...................... 257/79, 99, 88; 438/22, 28, 34
See application file for complete search history.

(56) References Cited

U.S. PATENT DOCUMENTS

| | | | | |
|---|---|---|---|---|
| 6,687,268 B2 * | 2/2004 | Kitamura et al. | ............... | 372/22 |
| 6,974,712 B2 * | 12/2005 | Ouchi et al. | ................... | 438/29 |
| 7,579,204 B2 * | 8/2009 | Nemoto | .......................... | 438/35 |
| 7,968,355 B2 * | 6/2011 | Kim | ............................... | 438/22 |

(Continued)

FOREIGN PATENT DOCUMENTS

JP    2010-056195 A    3/2010

OTHER PUBLICATIONS

U.S. Appl. No. 13/923,788, First Named Inventor: Jiro Higashino, Title: "Semiconductor Light Emitting Element", filed Jun. 21, 2013.

(Continued)

*Primary Examiner* — Nikolay Yushin
(74) *Attorney, Agent, or Firm* — Holtz, Holtz, Goodman & Chick PC (57) ABSTRACT

An LED device includes first and second LED elements containing a lower layer of first conductivity type, an active layer, and an upper layer of second conductivity type, wherein the second LED element has third and fourth electrodes on the lower layer, recessed portion having a side surface exposing the upper, active and lower layers, and reaching the third electrode, fifth electrode disposed on the upper layer extending on the side surface of the recessed portion, and connected with the third electrode, and groove extending from the upper layer and reaching the active layer between the third and fourth electrodes to electrically separate the third electrode from the fourth electrode.

10 Claims, 10 Drawing Sheets

(56) References Cited

U.S. PATENT DOCUMENTS

2013/0050653 A1 2/2013 Miyachi et al.
2013/0056757 A1 3/2013 Miyachi et al.
2013/0153951 A1 6/2013 Nihei et al.
2013/0221384 A1 8/2013 Saito et al.
2013/0248918 A1 9/2013 Miyachi et al.

OTHER PUBLICATIONS

U.S. Appl. No. 14/025,753, First Named Inventor: Takanobu Akagi, Title: "Semiconductor Light Emitting Device", filed Sep. 12, 2013.

* cited by examiner

SEMICONDUCTOR LIGHT EMITTING DEVICE

CROSS-REFERENCE TO RELATED APPLICATION

This application is based on and claims priority of Japanese patent application 2012-250536, filed on Nov. 14, 2012, the whole contents of which are incorporated herein by reference.

FIELD OF THE INVENTION

This invention relates to a semiconductor light emitting device and its manufacture.

RELATED ART

Nitride semiconductor light emitting diodes (LED) such as GaN diodes can emit ultraviolet or blue lights. By utilizing fluorescent material or phosphor, these LED's can emit white lights. White light emitting LED's are used, for example, for illumination or head lamp for vehicles. AlGaInN may be called GaN series.

Generally, sapphire is used as growth substrate for nitride semiconductor layers. Sapphire is an insulator and hence, when the sapphire substrate exists, n-side and p-side electrodes should be formed on front surfaces of the grown layers. Sapphire has a relatively low thermal conductivity, and is relatively poor in heat transfer. Recently, development has been done to remove the sapphire growth substrate by laser lift-off (LLO) or polishing. When the sapphire substrate is removed, for example, the rear surface of the n-type layer is exposed as well as the front surface of the p-type layer, and an n-side electrode and a p-side electrode can be formed on the rear and front surfaces.

An LED array containing a plurality of LED elements aligned on a substrate and connected in series is fitted for high power light source (for example see JP 2010-56195A). The inventors and their colleagues have proposed GaN series light emitting diode devices (for example, see U.S. patent application Ser. No. 13/588,305 (US2013/0050653), Ser. No. 13/598,951 (US2013/0056757), Ser. No. 13/712,194 (US2013/0153951), Ser. No. 13/779,694 (US2013/0221384), Ser. No. 13/845,063 (US2013/0248918), Ser. No. 13/923,788 and Ser. No. 14/025,753, which are incorporated herein by reference).

SUMMARY OF THE INVENTION

According to one aspect, a light emitting device includes:
a substrate having an insulating surface;
first, second and third counter electrodes separately disposed on the substrate;
a first light emitting element disposed on the first counter electrode and on first part of the second counter electrode above the substrate; and
a second light emitting element disposed on second part of the second counter electrode and on the third counter electrode above the substrate;
wherein,
the first light emitting element includes,
a first electrode disposed on the first part of the second counter electrode,
a first semiconductor lamination including a first semiconductor layer disposed on the first electrode and having a first conductivity type, a first active layer disposed on the first semiconductor layer, and a second semiconductor layer disposed on the first active layer and having a second conductivity type opposite to the first conductivity type, and
a second electrode disposed on the second semiconductor layer, and the second light emitting element includes,
a third electrode disposed on the second part of the second counter electrode,
a fourth electrode disposed on the third counter electrode,
a second semiconductor lamination including a third semiconductor layer disposed on the fourth electrode and having the first conductivity type, a second active layer disposed on the third semiconductor layer, and a fourth semiconductor layer disposed on the second active layer and having the second conductivity type,
at least one recessed portion having a side surface exposing the fourth semiconductor layer, the second active layer and the third semiconductor layer, and a bottom surface reaching the third electrode,
a fifth electrode disposed on the fourth semiconductor layer, extending on the side surface of the recessed portion, and connected with the third electrode, and
groove formed from the third semiconductor layer, and reaching at least the second active layer between the third and fourth electrodes so as to electrically separating the third electrode from the fourth electrode.

According to another aspect, a method of manufacturing a light emitting device includes:
growing on a growth substrate a semiconductor lamination including a first semiconductor layer having a first conductivity type, an active layer, and a second semiconductor layer having a second conductivity type opposite to the first conductivity type, the semiconductor lamination including a first light emitting element region and a second light emitting element region;
forming an electrode layer on the second semiconductor layer, and patterning a first electrode in the first light emitting element region, and a second electrode in the second light emitting region;
forming an etch stop layer on the second semiconductor layer, and patterning etch stopper in the second light emitting element region at location adjacent to the first light emitting element region where the second electrode does not exist;
etching the semiconductor lamination from the second semiconductor layer between the second electrode and the etch stopper to form a groove having a depth reaching the active layer in a shape capable of electrically separating a region including the etch stopper from a region including the second electrode;
etching the semiconductor lamination from the second semiconductor layer to reach the growth substrate, separating the first light emitting element region and the second light emitting element region;
forming first, second and third counter electrodes on a support substrate;
superposing the support substrate on the growth substrate such that the first, second and third counter electrodes are in contact with the first, and second electrodes and the etch stopper, and adhering contacted portions;
removing the growth substrate and exposing the first semiconductor layer;
etching the semiconductor lamination from the first semiconductor layer above said etch stopper, to form recessed portion having a side surface exposing the first semiconductor layer, the active layer, and the second semiconductor layer;
forming a fourth and fifth electrodes on the first and second light emitting element regions.

The object and advantages of the invention will be realized and attained by means of the elements and combinations particularly pointed out in the claims.

It is to be understood that both the foregoing general description and the following detailed description are exemplary and are not restrictive of the invention, as claimed.

BRIEF DESCRIPTION OF THE DRAWINGS

FIGS. 1Ap to 1Np are schematic plan views illustrating main processes of a method for manufacturing a light emitting device according to an embodiment.

FIGS. 1As to 1Ns are schematic cross-sectional views illustrating main processes of a method for manufacturing a light emitting device according to the embodiment.

FIGS. 2Ap and 2Bp are schematic plan views illustrating main processes of a first modification of the method for manufacturing a light emitting device according to the embodiment.

FIGS. 2As and 2Bs are schematic cross-sectional views illustrating main processes of the first modification of the method for manufacturing a light emitting device according to the embodiment.

FIGS. 3Ap and 3As are schematic plan and cross-sectional views illustrating main process of a second modification of the method for manufacturing a light emitting device according to the embodiment.

DESCRIPTION OF THE PREFERRED EMBODIMENTS

Figure 1:
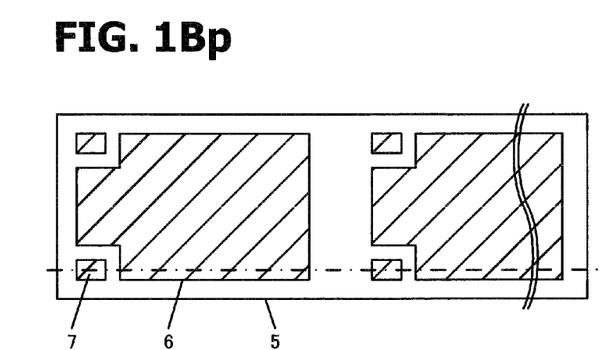

A method of manufacturing a light emitting device according to an embodiment will be described. FIGS. 1Ap to 1Mp are schematic plan views illustrating main processes of a method of manufacturing a light emitting device, and FIGS. 1As to 1Ms are cross sectional views along dotted broken lines in FIGS. 1Ap to 1Mp.

Referring to FIGS. 1Ap and 1As, epitaxial device structure 5 for emitting light is grown on a growth substrate 1. For example, the growth substrate 1 is formed of a sapphire substrate, and the epitaxial device structure 5 is formed of lamination of nitride semiconductor layers, such as AlGaInN series layers. The semiconductor layers may be grown by metal organic chemical vapor deposition (MOCVD).

For example, the sapphire substrate 1 is loaded in a MOCVD system, and heating (thermal cleaning) is done, for example, at 1000° C. for 10 minutes in hydrogen atmosphere. Then, a low temperature buffer layer (GaN layer) is grown at a low temperature, for example at about 500° C., by supplying TMG (tri-methyl-gallium) 10.4 micromol/min, $NH_3$ 3.3 SLM (standard liter per minute), for three minutes. Then, the substrate 1 is heated to 1000° C. and maintained thereat for 30 seconds to crystallize the low temperature buffer layer. At the same temperature, an underlying GaN layer (undoped GaN layer) is grown by supplying TMG 45 micromol/min, $NH_3$ 4.4 SLM. The undoped GaN layer may be grown to a thickness in a range of 1-3 micrometers. Continuously at 1000° C., a Si-doped n-type GaN layer 2 is grown to a thickness of about 5 micrometers by supplying TMG 45 micromol/min, $NH_3$ 4.4 SLM, and $SiH_4$ $2.7 \times 10^{-9}$ micromol/min. In the figure, the GaN buffer layer and the undoped GaN layer are jointly illustrated with the n-type GaN layer 2.

A multi quantum well light emitting layer (active layer) 3 of a thickness of the order of 50 nm, including InGaN quantum well layers, is grown on the n-type GaN layer 2 at 700° C.

Here, an InGaN/GaN lamination is set as one period, and growth of 5 periods is performed. In one period, an InGaN well layer of a thickness of about 2.2 nm is grown by supplying TMG 3.6 micromol/min, TMI (tri-methyl-indium) 10 micromol/min, and $NH_3$ 4.4 SLM, for 33 seconds, and a GaN barrier layer of a thickness of about 15 nm is grown by supplying TMG 3.6 micromol/min, and $NH_3$ 4.4 SLM for 320 seconds. A Mg-doped p-type Gan layer 4 of a thickness of the order of 0.5 micrometers is grown on the active layer 3 by supplying TMG 8.1 micromol/min, TMA (tri-methyl-aluminium) 7.5 micromol/min, $NH_3$ 4.4 SLM, and $Cp_2Mg$ (bis-cyclopentadienyl Mg) $2.9 \times 10^{-7}$ micromol/min. A GaN series device structure 5 is formed including the n-type GaN layer 2, the active layer 3, and the p-type GaN layer 4.

The growth substrate 1 is a single crystal substrate having lattice constant capable of epitaxially growing a GaN layer. When laser lift-off is done, the growth substrate is selected from the materials transparent at the absorption edge wavelength of 362 nm of GaN. Spinel, SiC, ZnO etc. may also be used as well as sapphire.

A p-side electrode 6 of a thickness of 200 nm and a desired shape is formed on the p-type GaN layer 4 by repeating electron beam deposition and lift-off. The p-side electrode 6 is formed for example of lamination of a Ni layer and a Ag layer. The Ag layer is formed to cover the upper and side surfaces of the Ni layer so as to serve also as a reflecting electrode. A reflecting electrode may be formed of a material selected from the group consisting of Ag, Pt, Ni, Al, Pd and their alloys.

A light emitting diode (LED) array is formed by serially connecting light emitting elements, which are separated by removing isolation regions of the device structure by etching to be aligned on a growth substrate. Simply, two elements horizontally adjacent to each other are schematically illustrated in the figure. The p-side electrode has a shape in which two corner areas are cut away for defining etch stopper areas.

Referring to FIGS. 1Bp and 1Bs, etch stopper layers 7 made of Au having a thickness equal to that of the p-side electrode, i.e. 200 nm, are formed in the etch stopper areas by sputtering and lift-off. The Au layer 7 constitutes a conducting electrode, and also serves as height adjusting layer. The Au layer 7 may be called auxiliary or subsidiary electrode.

Referring to FIGS. 1Cp and 1Cs, p-side adhesive layers 8 and n-side adhesive layers 9 made of Au layer of a thickness of 200 nm is formed on the p-side electrodes 6 and the auxiliary electrodes 7 by sputtering and lift-off. The p-side adhesive layer 8 and the n-side adhesive layer 9 serve as adhering layers connected with the support substrate as well as the electrodes.

A diffusion preventive film may be formed on the p-side electrode 6 and the auxiliary electrode 7, and then adhesive layers 8 and 9 may be formed thereon. The diffusion preventive film prevents diffusion of the element included in the p-side electrode 6, and may be formed of a sputtered TiW layer of a thickness of 300 nm. When the p-side electrode includes Ag, those materials as Ti, W, Pt, Mo, Ru, Ir, Au, and their alloys may be used for the diffusion preventive film.

The p-side electrode 8 (for example a Au layer) has certain degree of diffusion preventive function. For diffusion prevention, it is preferable to form the diffusion preventive layer and the p-side adhesive layer 8 to cover the upper and side surfaces of the p-side electrode 6.

Referring to FIGS. 1Dp and 1Ds, resist pattern RP1 is formed on the p-type GaN layer 4 covering the adhesive layers 8 and 9. The resist pattern PR1 has openings OP1 of L shape which separate the adhesive layers 8 and 9.

The device structure 5 exposed in the openings OP1 is etched, for example by dry etching using $Cl_2$ and Ar as etching gas, from the p-type GaN layer 4 to a depth at least reaching the active layer 3, and more safely to an intermediate depth in the n-type GaN layer 2 through the active layer 3, to form grooves 10. Thereafter, the resist pattern RP1 is removed. FIGS. 1Ep and 1Es illustrate the structure after removal of the resist pattern.

For example, the n-type GaN layer 2 has a thickness of about 5 micrometers, the active layer 3 has a thickness of about 50 nm, and the p-type GaN layer 4 has a thickness of about 0.5 micrometers. Etching for forming grooves 10 is done, for example, to a thickness of about 1 micrometer. The width of the groove 10 is, for example, about 3 micrometers. In the device structure 5, the area connected with the adhesive layer 8 can be electrically separated or isolated from the area connected with the adhesive layer 9.

Referring to FIGS. 1Fp and 1Fs, resist pattern RP2 having openings between designed light emitting elements is formed on the device structure 5 as a mask for separating the respective elements.

Referring to FIGS. 1Gp and 1Gs, the device structure 5 is etched between the elements until the growth substrate 1 is exposed using the resist pattern RP2 as an etching mask. In the figures, the elements 11a and 11b are separated. Etching proceeds not only vertically, but also horizontally. The opening space between the elements becomes wider as it goes upward. The side surfaces of the etched device structure 5 is so tapered that the horizontal size of the device structure becomes narrower as the position shifts upward. For example, dry etching using $Cl_2$ and Ar as etching gas is done. Thereafter, the resist pattern RP2 is removed. The respective grooves 10 have such shapes that each groove is continuous and both ends of each groove 10 reach the outer periphery of the device structure.

Referring to FIGS. 1Hp and 1Hs, a support substrate 21 is provided, and counter adhesive layers 23, 24, and 25 are formed on the support substrate 21. The support substrate 21 may be formed of a silicon substrate, on which a silicon oxide insulating film 22 is formed by thermal oxidation. The thickness of the silicon oxide film is sufficient if it provides sufficient insulation.

On the insulating film 22, for example, a Ti layer of a thickness of 150 nm, a Ni layer of a thickness of 50 nm, a Au layer of a thickness of 100 nm, a Pt layer of a thickness of 200 nm, and a AuSn layer of a thickness of 1000 nm (20 wt % Sn) are laminated and patterned to form counter adhesive layers 23, 24, and 25, by resistance heater deposition and lift-off.

The support substrate will be afterwards superposed on the light emitting elements 11a and 11b formed on the growth substrate 1. The counter adhesive layers 23-25 serve as adhesion layers connecting with the adhesive layers 8 and 9 of the light emitting elements 11a and 11b, and serve also as electrodes. FIG. 1Hp illustrates outline of the light emitting elements 11a and 11b superposed on the support substrate 21.

The counter adhesive layer 23 is formed at the location facing the n-side adhesive layers 9 of the light emitting element 11a. The counter adhesive layer 24 is formed to extend from the area of the light emitting element 11a to the area of the light emitting element 11b. More specifically, the counter adhesive layer 24 has main portion 24a formed at a location facing the p-side adhesive layer 8 of the light emitting element 11a, and a subsidiary portion 24b extending from the main portion 24a to the area of the light emitting element 11b to have an end at a location facing the n-side adhesive layers 9 of the light emitting element 11b. The counter adhesive layer 25 is formed at the location facing the p-side adhesive layer 8 of the light emitting element 11b.

The support substrate 21 is preferably formed of a material having a thermal expansion coefficient near those of sapphire ($7.5 \times 10^{-6}$/K) and GaN ($5.6 \times 10^{-6}$/K) constituting the device structure 5, and a high thermal conductivity. For example, Si, AlN, Mo, W, CuW etc. may be used.

The element side adhesive layers 8-9 and the counter adhesive layers 23-25 may be formed of a material selected from the group consisting of Au—Sn, Au—In, Pd—In, Cu—In, Cu—Sn, Ag—Sn, Ag—In, Ni—Sn, etc. capable of melt adhesion, or metals including Au capable of diffusion adhesion.

Referring to FIGS. 1Ip and 1Is, the element side adhesive layers 8 and 9 and the counter adhesive layers 23-25 are aligned their positions, the growth substrate 1 and the support substrate 21 are opposed to each other and brought into pressed contact with a pressure of 3 MPa, are heated to 300° C., maintained for 10 minutes, and then cooled down to room temperature, to achieve melt adhesion between the element side adhesive layers 8 and 9 and the counter adhesive layers 23-25. An adhesion layer is formed by this melt adhesion.

Locations of the p-side adhesive layer 8, the n-side adhesive layer 9 and the counter adhesive layer 24, which is disposed in the area between the p-side adhesive layer 8 of the light emitting element 11a and the n-side adhesive layer 9 of the light emitting element 11b, will be illustrated in the following plan views.

For example, UV excimer laser lights LS are irradiated from the rear surface of the sapphire substrate 1, to heat and decompose the buffer layer, to remove the growth substrate 1 by laser lift-off. FIGS. 1Jp and 1Js illustrate the structure after removing the growth substrate 1. The growth substrate 1 may also be removed by another method such as etching.

Residual Ga generated by laser lift-off is removed by hot water etc. and surface treatment is done with chloric acid. The n-type GaN layer 2 is exposed by this treatment. The agent used for surface treatment is not limitative if it can etch nitride semiconductor. Such acidic and alkaline agents as phosphoric acid, sulfuric acid, KOH, NaOH, etc. can be used. Surface treatment may be also done by dry etching using Ar plasma or chlorine series plasma, or by polishing.

The laser traces and/or laser damaged layers in the surface of the n-type GaN layer 2 is removed by Cl or Ar treatment using dry etching apparatus such as RIE apparatus, or by planarizing treatment using chemical mechanical polishing (CMP) apparatus. Further, the exposed surface of the n-type semiconductor layer 2 may be subjected to micro-cone (surface structure) process which improves light output efficiency.

Referring to FIGS. 1Kp and 1Ks, a photo-resist mask PR3 is formed covering the light emitting elements 11a and 11b. The resist pattern RP3 has openings OP2 of upwardly broadening tapered shape, located above the n-side adhesive layer 9. For example, after developing the resist layer, post-baking may be done to reform openings of upwardly broadening tapered shape.

Referring to FIGS. 1Lp and 1Ls, the device structure 5 exposed in the openings OP2 is etched from the n-type GaN layer 2 until the auxiliary electrode 7 is exposed. Etching of the semiconductor lamination may be done to transfer tapered shape of the resist pattern to recessed portions formed in the semiconductor lamination. Thereby, recessed portions 12 having tapered hole shape may be formed. The diameter of the recesses portion 12 increases as it goes upward. For example, dry etching using $Cl_2$ and Ar as etching gas is done. Thereafter, the resist pattern RP3 is removed.

Referring to FIGS. 1Mp and 1Ms, n-side electrodes 13 of desired shape are formed by forming a Ti layer of a thickness of 1 nm, an Al layer of a thickness of 200 nm, a Ti layer of a thickness of 100 nm and a Au layer of a thickness of 2000 nm, and patterning the laminated metal layers, by electron beam deposition and lift-off.

For example, as illustrated in FIG. 1Mp, the n-side electrode 13 has ladder shape including a pair of elongated portions 13a horizontally extending along the long side of the LED array and bridge portions 13b connecting the elongated portions 13a. The width of the portions 13a and 13b may be about 10 micrometers.

The n-side electrode 13 also has an interconnection portion 13c extending from the end of the elongated portion 13a, along the side surface of the recessed portion 12, and connected to the auxiliary electrode 7 at the bottom of the recessed portion 12. It is preferable that the interconnection portion 13c is formed on the whole side surface around the recessed portion 12. The interconnection portion 13c has a projected planar area containing the whole recessed portion 12. Since the recessed portion 12 has upwardly broadening tapered shape, deposition of the metal layer on the side surface of the recessed portion 12 becomes easy, and breaking of the interconnection portion 13c is suppressed. Also, it becomes easy to secure a rated current by metal wiring formed on tapered side walls.

For suppressing light absorption, the width of the n-side electrode portions 13a and 13b disposed on the upper surface of the n-type GaN layer 2 is preferably not too wide, and may be designed to be less than the width of the recessed portion 12. The left end portion of the electrode portion 13a may be gradually widened to smoothly continue to the interconnection portion 13c having a width wider than the recessed portion 12.

In the device structure 5, the area connected with the p-side adhesive layer 8 (and the p-side electrode 6) and the area connected with the n-side adhesive layer 9 are electrically separated by the groove 10. The area connected with the p-side adhesive layer 8 (which occupy a larger area of the element) serves as light emitting area. The recessed portions 12 are formed in areas including the n-side adhesive layers 9 located at the corner areas.

On the side surface of the recessed portion 12, the interconnection portion 13c extends on the n-type GaN layer 2, the active layer 3 and the p-type GaN layer 4. The semiconductor layers 4 and 3 in the area including the recessed portion 12 are electrically isolated from the light emitting area. Therefore, the interconnection portion 13c covering the active layer 3 and the p-type layer 4 causes no short-circuit problem over the pn junction. Thus, there is no need of forming an insulating layer on the side surface of the recessed portion 12 before forming the n-side electrode 13.

The auxiliary electrode 7 formed of a conducting metal material is exposed by the etching for forming the recessed portion 12. The surface portion of the auxiliary electrode 7 may be somewhat etched. There is some possibility of depositing some conducting material on the side surface of the recessed portion 12 due to the etching of the auxiliary electrode 7, However, short circuit of the pn junction on the side surface of the recessed portion causes no problem as described above.

In the element 11b, the n-side electrode 13 is connected to the auxiliary electrode 7 via the recessed portion 12, and the auxiliary electrode 7 is connected with the counter adhesive layer 24 via the n-side adhesive layer 9. The counter adhesive layer 24 is continuous to the element 11a, and is connected to the p-side electrode 6 via the p-side adhesive layer 8 in the element 11a. In this way, serial connection structure which electrically connects the n-side electrode 13 of the light emitting element 11b and the p-side electrode 6 of the light emitting element 11a is provided.

The p-side adhesive layer 8 and the p-side electrode 6 can be collectively considered as one electrode. The n-side adhesive layer 9 and the auxiliary electrode 7 formed of a conducting material can be collectively considered as one electrode.

The n-side electrode 13 of the light emitting element 11a is connected with the auxiliary electrode 7 via the recessed portion 12, and the auxiliary electrode 7 is connected to the counter adhesive layer 23 via the n-side adhesive layer 9. Similar to the interconnection structure between the light emitting element 11b with the light emitting element 11a, the light emitting element 11a can be serially connected to another light emitting element disposed on the left via the counter adhesive layer 23.

The p-side electrode 6 of the light emitting element 11b is connected with the counter adhesive layer 25 via the p-side adhesive layer 8. Similar to the interconnection structure between the light emitting element 11a with the light emitting element 11b, the light emitting element 11b can be serially connected to another light emitting element disposed on the right via the counter adhesive layer 25. In this way, an LED array including a plurality of light emitting elements connected in series is formed.

Thereafter, the support substrate 21 is divided by laser scribing or dicing to provide a plurality of LED arrays.

Suppose that four light emitting elements S1-S4 are aligned in one raw to constitute an LED array as depicted in FIG. 1Np. The counter adhesive layer 23 of the leftmost light emitting element S1 is derived leftward to form a bonding region. Adjacent light emitting elements are electrically connected via counter adhesive layers 24. The counter adhesive layer 25 of the rightmost light emitting element S4 is derived to the right side region of the light emitting element S4 to form a bonding region.

As depicted in FIG. 1Ns, a sealing resin layer 30 is formed covering the LED array including a plurality of light emitting elements. The sealing resin layer 30 fills also the grooves 10. Facing semiconductor laminations increase the optical coupling via the sealing resin 30. Fluorescent particles 31 are contained in the sealing resin 30 to generate lights of desired wavelength. For example, blue light emitting GaN LEDs are covered by sealing resin containing yellow light emitting fluorescent material, to obtain white lights by the blue and yellow lights. It is also possible to use a sealing resin containing a plural kinds of fluorescent materials.

When predetermined voltage is applied to the respective light emitting elements via the bonding regions, light emissions occur from the device structures 5 of the respective light emitting elements. The p-side electrode 6 serves as a light reflecting electrode, and reflects the incoming lights upward (to the side of the n-side electrode 13).

The area containing the recessed portion 12 (area containing the n-side adhesive layer 9) separated from the light emitting area by the groove 10 does not emit lights. Lights emitted from the light emitting region and propagating laterally inject into the separated semiconductor lamination over the groove 10. Semiconductor layers have higher refractive indices than the sealing resin and air, and serve as light guide. The device structure 5 around the recessed portion 12 becomes light guide region.

In the above embodiment, the areas for forming recessed portions are located at two corner portions adjacent to the next light emitting element, through which the n-side electrodes 13 are connected to the next light emitting element. The number and position of the recessed portions can be appropriately changed according to necessity. The shape of the recessed portion 12 is not limitative. For example the shape may be changed to a circular shape. The shape of the n-side electrodes 13 may also be appropriately changed according to necessity.

The serial connection structure of light emitting elements can be applied to other devices than the nitride series semiconductor light emitting elements. Application can also be done to the light emitting structure in which n-type and p-type are interchanged in the above described embodiment.

Description will be made on the method for manufacturing a light emitting device according to first modification of the embodiment. In the above embodiment, the recessed portion is formed in hole shape penetrating through the device structure 5. In this modification, the recessed portion 12 is formed in cut-away shape at the corner of the element. The manufacturing processes are similar up to the process illustrated in FIGS. 1Jp and 1Js.

Figure 2:
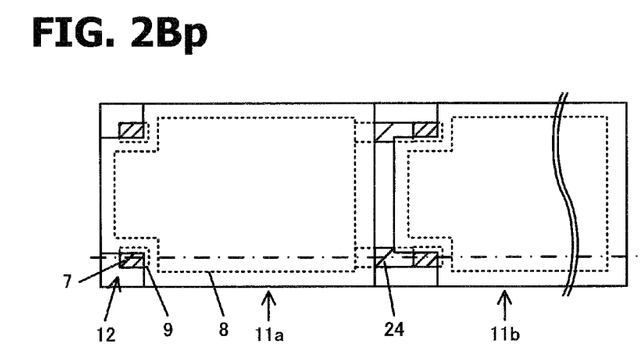

FIGS. 2Ap and 2Bp are schematic plan views illustrating main processes of the method for manufacturing a light emitting device according to the first modification, and FIGS. 2As and 2Bs are schematic cross-sectional views along dotted broken lines in FIGS. 2Ap and 2Bp.

Referring to FIGS. 2Ap and 2As, the process illustrated corresponds to the process described referring to FIGS. 1Kp and 1Ks, and resist pattern RP3 is formed on the device structure 5 for forming recessed portions 12. Difference lies in that the openings OP2 formed at the corners of the element have such shape that the corners of the device structure 5 will be cut away.

Referring to FIGS. 2Bp and 2Bs, this process corresponds to the process described referring to FIGS. 1Lp and 1Ls, and recessed portions 12 are formed by etching using the resist pattern RP3 as a mask. Recessed portions 12 having such shape that corners of the device structure 5 are cut away. Thereafter the n-side electrode 13 will be formed similar to the embodiment to form the light emitting device of the first modification.

Description will then be made on second modification of the embodiment. In the embodiment, the auxiliary electrode is formed of a conducting material (for example Au). In this modification, an insulating film serving as etch stopper is used in place of the auxiliary electrode 7. In the process of forming the auxiliary electrodes 7 described referring to FIGS. 1Bp and 1Bs, an etch stopper layer 7 is made of an silicon oxide layer having same or similar thickness as the p-side electrode 6 is formed by sputtering and lift-off. Thereafter, processes similar to those of the embodiment are done up to the process described referring to FIGS. 1Kp and 1Ks.

Figure 3:
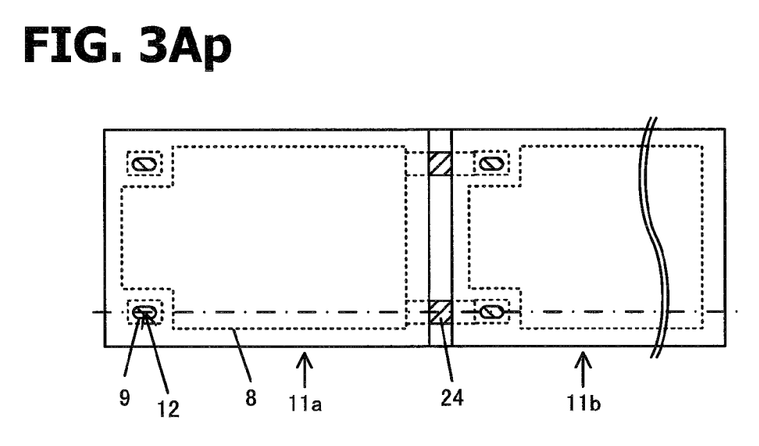

Referring to FIGS. 3Ap and 3As, the process corresponds to the process described referring to FIGS. 1Lp and 1Ls, and recessed portions 12 are formed by etching using the resist pattern RP3 as a mask.

First stage etching for the full thickness of the device structure (nitride series semiconductor layers) 5 is similar to the embodiment. For example, dry etching using $Cl_2$ and Ar as etching gas is employed for the first stage etching. In this modification, second stage etching for etching through the etch stopper layer (silicon oxide layer) 7 to expose the n-side adhesive layer 9 serving as electrode is further done. For example, dry etching using $CF_4$ and Ar as etching gas is employed as the second stage etching. Thereafter, the resist pattern RP3 is removed.

Thereafter, formation of the n-side electrode 13 etc. will be performed similar to the embodiment, to form the light emitting device of the second modification.

As described above, the etch stopper layer is not limited to the conducting material, and can also be formed of an insulating material. In case the etch stopper is formed of an conducting material, etching through the etch stopper can be dispensed with.

Figure 4A:
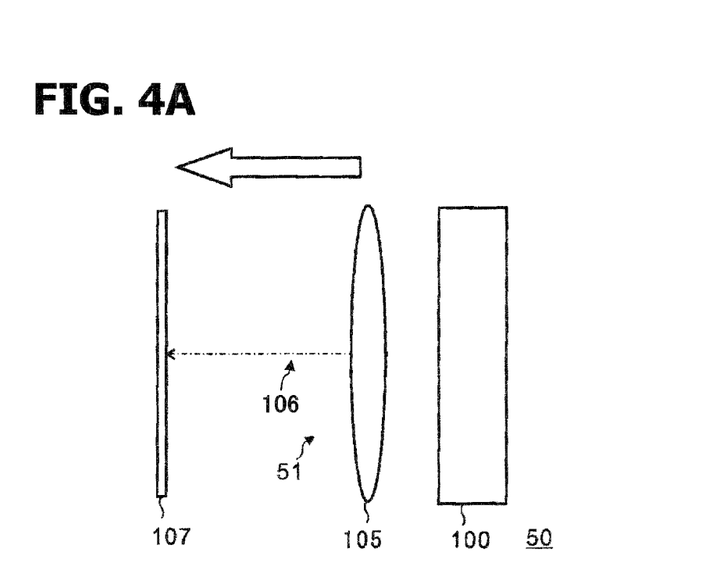
FIGS. 4A and 4B are schematic cross-sectional views of vehicle lighting apparatuses.
Figure 4B:
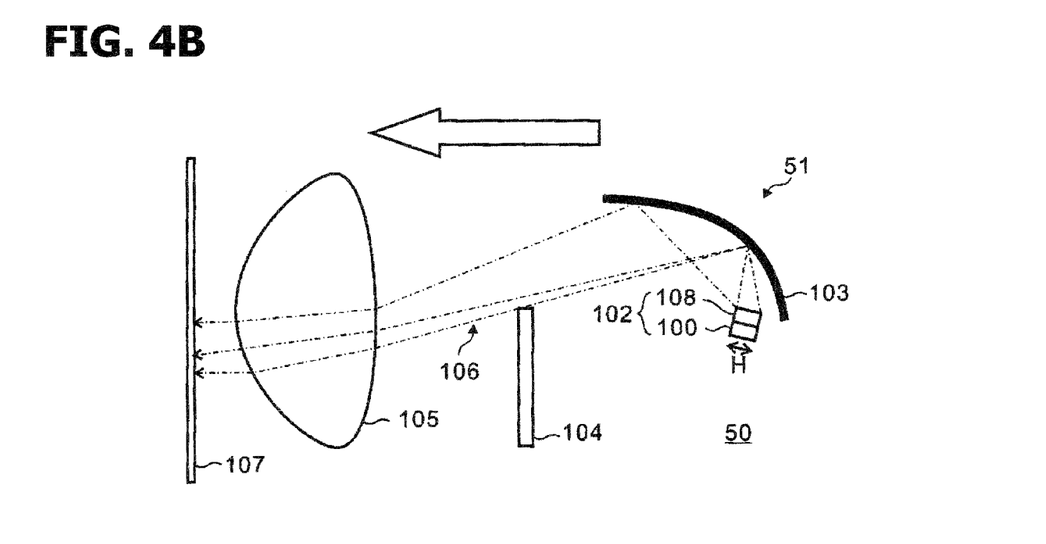

Now description will be made on vehicle lighting apparatus (head lamp) embodying the LED array according to an application. FIG. 4A and FIG. 4B are schematic cross-sections illustrating structures of automotive lightings (headlamps) according to applications.

FIG. 4A illustrates a vehicle lighting apparatus 50 including a projection optical system 51. The projection lens 105 is designed to make optical source image 106 of the LED array 100 on a virtual vertical screen (projection surface) 107 which faces a front of a vehicle.

FIG. 4B illustrates another vehicle lighting apparatus 50 including a projection optical system 51. A projection optical system 51 can be equipped with a multireflector (reflection surfaces) 103 and a projection lens 105. The headlamp 50 illustrated in FIG. 4B includes a light source 102 formed of an LED array 100 and a fluorescent material layer 108 covering the LED array, and a projection optical system 51 including reflection surfaces 103 which are multireflectors divided into a plurality of small reflection regions, a shade 104 and a projector lens 105.

As depicted in FIG. 4B, the light source is positioned to make its projecting direction (light emitting surface) upward. The reflection surface 103 is a spheroidal reflection surface whose first focal point is set near the light source and second focal point is set near the upper edge of the shade 104, and it is positioned to cover the side and the front of the light source so that lights from the light source irradiate the reflection surface 103.

As depicted in FIG. 4B, the reflection surface 103 projects the light source images 106 of the plurality of the LED array 100 of the light source to the front of a vehicle and is designed to project the light source images 106 of the LED array 100 on the virtual vertical screen (projection surface) 107 which faces the front of the vehicle.

The shade 104 is a shading part for shading a portion of reflected light from the reflection surface 103 to form a cutoff line suitable for a headlamp. The shade 104 is disposed between the projection lens 105 and the light source 102, placing its upper edge near the focal point of the projection lens 105.

The projection lens 105 is positioned on the front of the vehicle and irradiates the reflected light from the reflection surface 103 onto the projection surface 107.

As described above, LED arrays having a plurality of light emitting elements connected in series can be formed. Such LED arrays are fitted for lighting apparatuses used at high output such as vehicle lighting apparatuses. Although vehicle lighting apparatuses are described as applications, the LED array can also be used for general lighting use, large size back light, etc.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

What are claimed are:

1. A light emitting device comprising:
a substrate having an insulating surface;
first, second and third counter electrodes separately disposed on the substrate;
a first light emitting element disposed on the first counter electrode and on first part of the second counter electrode above the substrate; and
a second light emitting element disposed on second part of the second counter electrode and on the third counter electrode above the substrate;
wherein,
the first light emitting element comprises,
a first electrode disposed on the first part of the second counter electrode,
a first semiconductor lamination including a first semiconductor layer disposed on the first electrode and having a first conductivity type, a first active layer disposed on the first semiconductor layer, and a second semiconductor layer disposed on the first active layer and having a second conductivity type opposite to the first conductivity type, and
a second electrode disposed on the second semiconductor layer, and the second light emitting element comprises,
a third electrode disposed on the second part of the second counter electrode,
a fourth electrode disposed on the third counter electrode,
a second semiconductor lamination including a third semiconductor layer disposed on the fourth electrode and having the first conductivity type, a second active layer disposed on the third semiconductor layer, and a fourth semiconductor layer disposed on the second active layer and having the second conductivity type,
at least one recessed portion having a side surface exposing the fourth semiconductor layer, the second active layer and the third semiconductor layer, and a bottom surface reaching the third electrode,
a fifth electrode disposed on the fourth semiconductor layer, extending on the side surface of the recessed portion, and connected with the third electrode, and
groove formed from the third semiconductor layer, and reaching at least the second active layer between the third and fourth electrodes so as to electrically separating the third electrode from the fourth electrode.

2. The light emitting device according to claim 1, wherein the recessed portion has a shape of hole formed penetrating through the second semiconductor lamination.

3. The light emitting device according to claim 2, wherein the recessed portion has a tapered side surface which defines a diameter increasing upward.

4. The light emitting device according to claim 3, wherein the fifth electrode is formed on the whole looped side surface of the recessed portion.

5. The light emitting device according to claim 1, further comprising sealing resin body covering the first and second light emitting elements on the substrate, and filling the groove.

6. The light emitting device according to claim 5, wherein the sealing resin body contains fluorescent particles.

7. The light emitting device according to claim 1, further comprising optical system including a reflecting surface and a lens to which lights emitted from the first and second light emitting elements inject.

8. A method of manufacturing a light emitting device comprising:
growing on a growth substrate a semiconductor lamination including a first semiconductor layer having a first conductivity type, an active layer, and a second semiconductor layer having a second conductivity type opposite to the first conductivity type, the semiconductor lamination including a first light emitting element region and a second light emitting element region;
forming an electrode layer on the second semiconductor layer, and patterning a first electrode in the first light emitting element region, and a second electrode in the second light emitting region;
forming an etch stop layer on the second semiconductor layer, and patterning etch stopper in the second light emitting element region at location adjacent to the first light emitting element region where the second electrode does not exist;
etching the semiconductor lamination from the second semiconductor layer between the second electrode and the etch stopper to form a groove having a depth reaching the active layer in a shape capable of electrically separating a region including the etch stopper from a region including the second electrode;
etching the semiconductor lamination from the second semiconductor layer to reach the growth substrate, separating the first light emitting element region and the second light emitting element region;
forming first, second and third counter electrodes on a support substrate;
superposing the support substrate on the growth substrate such that the first, second and third counter electrodes are in contact with the first, and second electrodes and the etch stopper, and adhering contacted portions;
removing the growth substrate and exposing the first semiconductor layer;
etching the semiconductor lamination from the first semiconductor layer above said etch stopper, to form recessed portion having a side surface exposing the first semiconductor layer, the active layer, and the second semiconductor layer;
forming a fourth and fifth electrodes on the first and second light emitting element regions.

9. The method of manufacturing a light emitting device according to claim 8, wherein the etch stopper is a third electrode, and forming the recessed portion exposes the third electrode at a bottom.

10. The method of manufacturing a light emitting device according to claim 9, wherein the fifth electrode is connected with the second counter electrode via the third electrode.

* * * * *